(12) United States Patent
Park

(10) Patent No.: US 8,819,504 B2
(45) Date of Patent: Aug. 26, 2014

(54) NONVOLATILE MEMORY DEVICE AND METHOD FOR OPERATING THE SAME

(75) Inventor: Won-Sun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 318 days.

(21) Appl. No.: 13/103,449

(22) Filed: May 9, 2011

(65) Prior Publication Data

US 2012/0221904 A1 Aug. 30, 2012

(30) Foreign Application Priority Data

Feb. 28, 2011 (KR) ........................ 10-2011-0017927

(51) Int. Cl.
*G11C 29/44* (2006.01)
*G11C 29/54* (2006.01)

(52) U.S. Cl.
USPC .......................................... 714/723; 714/710

(58) Field of Classification Search
None
See application file for complete search history.

(56) References Cited

U.S. PATENT DOCUMENTS

| 4,369,511 | A | * | 1/1983 | Kimura et al. ................. 714/719 |
| 5,337,318 | A | * | 8/1994 | Tsukakoshi et al. ........... 714/708 |
| 5,831,989 | A | * | 11/1998 | Fujisaki ......................... 714/723 |
| 7,405,976 | B2 | * | 7/2008 | Hebishima ................ 365/185.22 |
| 2002/0080666 | A1 | * | 6/2002 | Takahashi et al. ............. 365/200 |
| 2008/0028260 | A1 | * | 1/2008 | Oyagi et al. ........................ 714/6 |

FOREIGN PATENT DOCUMENTS

| KR | 1020080029303 | 4/2008 |
| KR | 1020080046826 | 5/2008 |
| KR | 1020100040288 | 4/2010 |
| KR | 1020100081092 | 7/2010 |

OTHER PUBLICATIONS

Notice of Allowance issued by the Korean Intellectual Property Office on Jun. 28, 2012.

* cited by examiner

*Primary Examiner* — Ajay Bhatia
*Assistant Examiner* — Dipakkumar Gandhi
(74) *Attorney, Agent, or Firm* — IP & T Group LLP

(57) ABSTRACT

A nonvolatile memory device includes a first storage unit configured to store a plurality of first fault address information provided in a first test operation, a second storage unit configured to store a plurality of second fault address information provided in a second test operation which is performed later than the first test operation; a redundancy operation unit configured to, in performing a redundancy operation, determine the number of operation circuits corresponding to the first fault address information and the number of operation circuits corresponding to the second fault address information among a plurality of redundancy operation circuits based on address number information; and an address providing unit configured to read the plurality of first fault address information and the plurality of second fault address information, and sequentially provide the read information to the redundancy operation unit, wherein the address providing unit is further configured to detect the number of the first fault address information and generate the address number information.

18 Claims, 2 Drawing Sheets

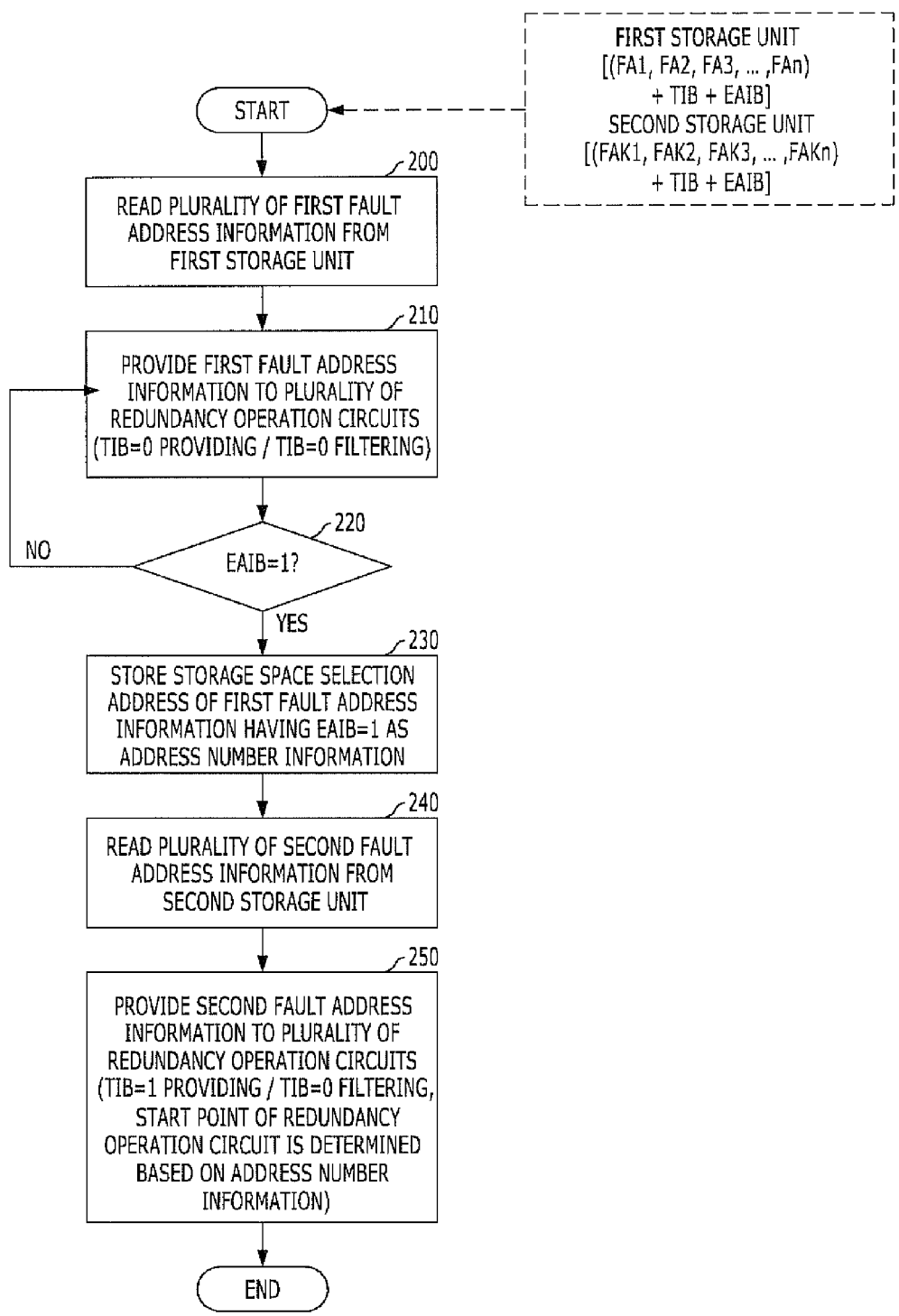

NONVOLATILE MEMORY DEVICE AND METHOD FOR OPERATING THE SAME

CROSS-REFERENCE TO RELATED APPLICATIONS

The present application claims priority of Korean Patent Application No. 10-2011-0017927, filed on Feb. 28, 2011, which is incorporated herein by reference in its entirety.

BACKGROUND

1. Field

Exemplary embodiments of the present invention relate to semiconductor design technology, and more particularly, to a nonvolatile memory device and a method for operating the same.

2. Description of the Related Art

Since a nonvolatile memory device has both features of a random access memory (RAM), which can freely record and erase data, and features of a read only memory (ROM), which can retain stored data without supply of power, it may be used as a storage medium for a portable electronic device, such as a digital camera, a personal digital assistant (PDA), and an MP3 player.

A nonvolatile memory device often includes a plurality of nonvolatile memory cells which are electrically programmable and erasable. A basic structure of a single nonvolatile memory device includes a gate structure in which a floating gate and a control gate are stacked, a source, and a drain. The nonvolatile memory cell performs a program, erase or read operation by applying appropriate voltages to the control gate, the source, the drain, and a well.

A plurality of nonvolatile memory cells are grouped based on units of word lines and bit lines to constitute a memory cell array. The memory cell array is divided into a main cell array, a redundancy cell array, and a code address memory (CAM) cell array, depending on usage thereof.

The main cell array includes memory cells for performing program and erase operations, and the redundancy cell array includes redundancy cells for defective cells of the main cell array. The CAM cell array includes memory cells for storing information of normal cells or defective cells.

The operation of programming fault column address information of a conventional nonvolatile memory device into a CAM cell array is as follows.

Fault column address information FA1, FA2, FA3, ..., FAn generated in a probe test is collected. The collected fault column address information FA1, FA2, FA3, FAn is programmed in a CAM cell array region of a NAND flash. At this time, the operation of programming the fault column address information FA1, FA2, FA3, ..., FAn into the CAM cell array region is identical to the program operation of a nonvolatile memory device. That is, after the CAM cell array is erased, the collected fault column address information FA1, FA2, FA3, ..., FAn is set to a page buffer corresponding to the erased CAM cell array and is programmed and stored in the corresponding CAM cell array.

When the probe test is completed, a wafer is packaged and a package test (PKT) is performed. At this time, since fault column address information FAK1, FAK2, FAK3, ..., FAKm is additionally generated, the additionally generated fault column address information FAK1, FAK2, FAK3, ..., FAKm should be programmed into the corresponding CAM cell array.

Therefore, the corresponding CAM cell array should be erased before the additionally generated fault column address information FAK1, FAK2, FAK3, ..., FAKm is programmed in the corresponding CAM cell array. However, fault column address information FA1, FA2, FA3, ..., FAn already generated in the probe test is programmed in the corresponding CAM cell array. Thus, if the corresponding CAM cell array is erased in order to store the fault column address information FAK1, FAK2, FAK3, ..., FAKm additionally generated in the package test, the fault column address information FA1, FA2, FA3, ..., FAn programmed in the probe test is erased.

Therefore, before the corresponding CAM cell array is erased, the fault column address information FA1, FA2, FA3, ..., FAn generated in the probe test and programmed in the corresponding CAM cell array is to be read and stored in the memory of the test device.

After the fault column address information FA1, FA2, FA3, ..., FAn generated in the probe test is stored in the memory of the test device and the corresponding CAM cell array is erased, the fault column address information FA1, FA2, FA3, ..., FAn generated in the probe test and the fault column address information FAK1, FAK2, FAK3, ..., FAKm generated in the package test are collected and stored in the page buffer corresponding to the erased CAM cell array and subsequently programmed and stored in the corresponding CAM cell array. In this manner, all fault address information generated in the nonvolatile memory device is finally stored in the corresponding CAM cell array.

However, in temporarily storing the fault column address information FA1, FA2, FA3, ..., FAn, which is generated in the probe test and already programmed, in the test device in order to additionally program the fault column address information FAK1, FAK2, FAK3, ..., FAKm generated in the package test, a heavy burden may be imposed on the operation of the test device using the finite memory.

Due to the burden imposed on the operation of the test device, more time may be taken to perform the test operation.

SUMMARY

An embodiment of the present invention is directed to a circuit and method for programming fault column address information of a nonvolatile memory device in a CAM cell array stably without using a memory of a test device.

In accordance with an embodiment of the present invention, a nonvolatile memory device includes: a first storage unit configured to store a plurality of first fault address information provided in a first test operation; a second storage unit configured to store a plurality of second fault address information provided in a second test operation which is performed after the first test operation; a redundancy operation unit configured to, in performing a redundancy operation, determine the number of operation circuits corresponding to the first fault address information and the number of operation circuits corresponding to the second fault address information among a plurality of redundancy operation circuits based on address number information; and an address providing unit configured to read the plurality of first fault address information and the plurality of second fault address information, and sequentially provide the read information to the redundancy operation unit, wherein the address providing unit is further configured to detect the number of the first fault address information and generate the address number information.

In accordance with another embodiment of the present invention, a method for operating a nonvolatile memory device having a plurality of redundancy operation circuits for performing a redundancy operation includes: storing a plurality of first fault address information provided in a first test operation and detecting the number of the plurality of stored first fault address information; storing a plurality of second fault address information provided in a second test operation; and allocating redundancy operation circuits corresponding to the plurality of first and second fault address information among the plurality of redundancy operation circuits based on the detected number of the first fault address information.

BRIEF DESCRIPTION OF THE DRAWINGS

FIG. 2 is a flowchart illustrating the operation of the nonvolatile memory device of FIG. 1 in accordance with the embodiment of the present invention.

DETAILED DESCRIPTION

Figure 1:
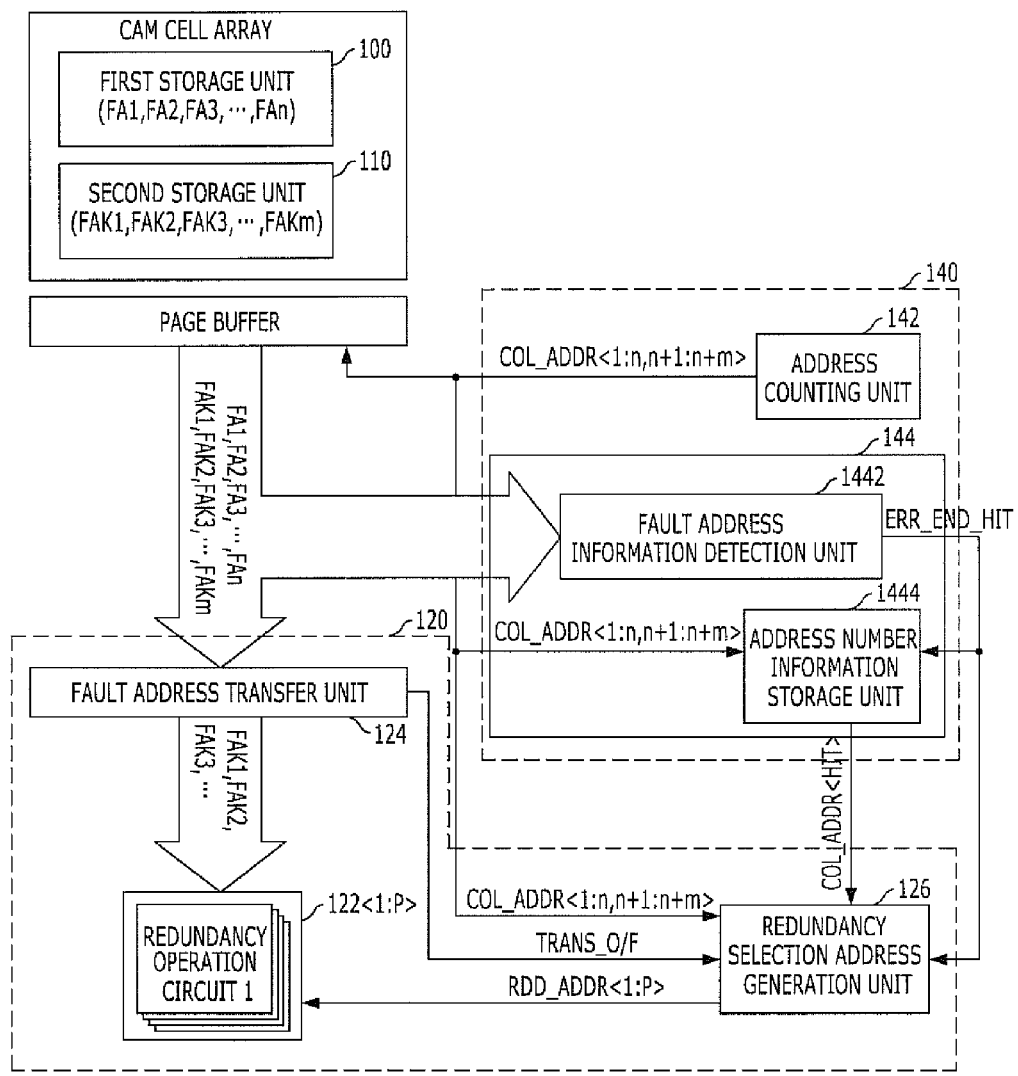
FIG. 1 is a block diagram illustrating a nonvolatile memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a nonvolatile memory device in accordance with an embodiment of the present invention.

The configuration of a first storage unit 100 and a second storage unit 110 included in a CAM cell array of FIG. 1 is described as follows.

The first storage unit 100 is included in the CAM cell array and is used to store only a plurality of first fault address information FA1, FA2, FA3, . . . , FAn provided in a probe test operation. In addition, the second storage unit 110 is included in the CAM cell array and is used to store only a plurality of second fault address information FAK1, FAK2, FAK3, . . . , FAKm provided in a package test operation. The first storage unit 100 and the second storage unit 110 can be independently erased. Thus, the plurality of first fault address information FA1, FA2, FA3, . . . , FAn provided in the probe test operation and previously stored need not be transferred to an external test device before storing the plurality of second fault address information FAK1, FAK2, FAK3, . . . , FAKm provided in the package test operation.

While the configuration of the CAM cell array where it is divided into the first storage unit 100 and the second storage unit 110 allows the above described features, there are also the following features.

Specifically, the actually used number of the plurality of first fault address information FA1, FA2, FA3, . . . , FAn, which are provided in the probe test operation and are to be stored in the first storage unit 100, and the actually used number of the plurality of second fault address information FAK1, FAK2, FAK3, . . . , FAKm, which are provided in the package test operation and are to be stored in the second storage unit 110 are not known in advance.

That is, when a plurality of nonvolatile memory devices exist, it is usual that the actually used number of the first fault address information FA1, FA2, FA3, . . . , FAn and the actually used number of the second fault address information FAK1, FAK2, FAK3, . . . , FAKm, which may be generated in the respective nonvolatile memory devices, are different from each other.

The size of the first storage unit 100 is determined based on "n", which is the maximum number of the first fault address information FA1, FA2, FA3, . . . , FAn, and the size of the second storage unit 110 is determined based on "m", which is the maximum number of the second fault address information FAK1, FAK2, FAK3, . . . , FAKm.

Meanwhile, just as the first storage unit 100 and the second storage unit 110 are divided, a redundancy resource for performing a redundancy operation may also be divided into a redundancy resource corresponding to the first storage unit 100, and a redundancy resource corresponding to the second storage unit 110. More specifically, the redundancy resource is divided into a redundancy resource which can perform a redundancy operation in correspondence to the first fault address information FA1, FA2, FA3, . . . , FAn, and a redundancy resource which can perform a redundancy operation in correspondence to the second fault address information FAK1, FAK2, FAK3, . . . , FAKm, and these redundancy resources are not shared. Since the actually used number of the first fault address information FA1, FA2, FA3, . . . , FAn is not known in advance, the address position of the redundancy resource to which the actually used number of the second fault address information FAK1, FAK2, FAK3, . . . , FAKm is applied is to be determined.

When the above-discussed division of the redundancy resource according to the division of the first storage unit 100 and the second storage unit 110 is used, if, for example, the number of fault address information which can be processed among the entire redundancy resources is 100, the redundancy resources may be previously divided in such a manner that the redundancy resource allocated to the first storage unit 100 can process 50 fault address information, and the redundancy resource allocated to the second storage unit 110 can process 50 fault address information.

In this state, the redundancy operation may be properly performed if the actually used number of the first fault address information FA1, FA2, FA3, . . . , FAn stored in the first storage unit 100 is 40 (which is less than 50 and where the first fault address information FA1 to FA40 is used and the first fault address information FA41 to FAn is not used), and the actually used number of the second fault address information FAK1, FAK2, FAK3, . . . , FAKm stored in the second storage unit 110 is 30 (which is less than 50 and the second fault address information FAK1 to FAK30 is used and the second fault address information FAK31 to FAKm is not used). However, if the actually used number of the first fault address information FA1, FA2, FA3, . . . , FAn stored in the first storage unit 100 is 60 (the first fault address information FA1 to FA60 is used and the first fault address information FA61 to FAn is not used), and the actually used number of the second fault address information FAK1, FAK2, FAK3, . . . , FAKm stored in the second storage unit 110 is 20 (the second fault address information FAK1 to FAK20 is used and the second fault address information FAK21 to FAKm is not used), the redundancy resources are not appropriately distributed for the actually used amount of the first fault address information FA1, FA2, FA3, . . . , FAn and thus the redundancy operation is not properly performed, even though the redundancy resources corresponding to the second fault address information FAK1, FAK2, FAK3, . . . , FAKm sufficiently remain. Here, the redundancy operation is not properly performed even though the sum of the actually used number of the first fault address information FA1, FA2, FA3, . . . , FAn and the actually used number of the second fault address information FAK1, FAK2, FAK3, . . . , FAKm is less than the total number of the redundancy resources.

To address such features, the nonvolatile memory device in accordance with an exemplary embodiment of the present invention is designed so that the redundancy operation is performed in such a manner that the first storage unit 100 and the second storage unit 110 share the redundancy resources.

Specifically, referring to FIG. 1, the nonvolatile memory device in accordance with the embodiment of the present invention includes the first storage unit 100, the second storage unit 110, a redundancy operation unit 120, and an address providing unit 140. The first storage unit 100 stores the plurality of first fault address information FA1, FA2, FA3, . . . , FAn provided in the probe test (PT) operation. The second storage unit 110 stores the plurality of second fault address information FAK1, FAK2, FAK3, . . . , FAKm provided in the package test (PKT) operation. The redundancy operation unit 120 determines the number of operation circuits corresponding to the first fault address information FA1, FA2, FA3, . . . , FAn and the number of operation circuits corresponding to the second fault address information FAK1, FAK2, FAK3, . . . , FAKm among a plurality of redundancy operation circuits 122<1:P> provided in order to perform the redundancy operation, based on address number information COL_ADDR<HIT>. The address providing unit 140 reads the first fault address information FA1, FA2, FA3, . . . , FAn and the second fault address information FAK1, FAK2, FAK3, . . . , FAKm, and sequentially provides the read information to the redundancy operation unit 120. In addition, the address providing unit 140 detects the number of the first fault address information FA1, FA2, FA3, . . . , FAn and generates the address number information COL_ADDR<HIT>.

The first storage unit 100 includes a plurality of first fault address storage spaces (which are not directly shown) for storing the plurality of first fault address information FA1, FA2, FA3, . . . , FAn provided in the probe test operation. At this time, test information bits (TIB) and end address information bits (EAIB) are added to the respective first fault address information FA1, FA2, FA3, . . . , FAn stored in the respective first fault address storage spaces.

For example, if the plurality of first fault address information FA1, FA2, FA3, . . . , FAn provided through the probe test operation are 14-bit codes, the test information bit (TIB) and the end address information bit (EAIB) are added and thus the plurality of first fault address information FA1, FA2, FA3, . . . , FAn finally stored in the first storage unit 100 will become 16-bit codes. That is, in a case in which the number of the first fault address information to be stored in the first storage unit 100 is 2 and their values are "0x0200" and "0x0400". The first one of the first fault address information stored in the first fault address storage space of the first storage unit 100 is as follows: b15(EAIB)=0, b14(TIB)=0, b13=0, b12=0, b11=0, b10=0, b9=1, b8=0, b7=0, b6=0, b5=0, b4=0, b3=0, b2=0, b1=0, b0=0. The second one of the first fault address information stored in the second fault address storage space of the first storage unit 100 is as follows: b15(EAIB)=1, b14(TIB)=0, b13=0, b12=0, b11=0, b10=1, b9=0, b8=0, b7=0, b6=0, b5=0, b4=0, b3=0, b2=0, b1=0, b0=0.

Likewise, the second storage unit 110 includes a plurality of second fault address storage spaces (which are not shown) for storing the plurality of second fault address information FAK1, FAK2, FAK3, . . . , FAKm provided in the package test operation. At this time, test information bits (TIB) and end address information bits (EAIB) are added to the respective second fault address information FAK1, FAK2, FAK3, . . . , FAKm stored in the respective second fault address storage spaces.

For example, if the plurality of second fault address information FAK1, FAK2, FAK3, . . . , FAKm provided through the package test operation are 14-bit codes, the test information bit (TIB) and the end address information bit (EAIB) are added and thus the plurality of second fault address information FAK1, FAK2, FAK3, . . . , FAKm finally stored in the second storage unit 110 will become 16-bit codes. That is, in a case in which the number of the second fault address information to be stored in the second storage unit 110 is 2 and their values are "0x0200" and "0x0400". The first one of the second fault address information stored in the second fault address storage space of the second storage unit 110 is as follows: b15(EAIB)=0, b14(TIB)=0, b13=0, b12=0, b11=0, b10=0, b9=1, b8=0, b7=0, b6=0, b5=0, b4=0, b3=0, b2=0, b1=0, b0=0. The second one of the second fault address information stored in the second fault address storage space of the second storage unit 110 is as follows: b15(EAIB)=1, b14(TIB)=0, b13=0, b12=0, b11=0, b10=1, b9=0, b8=0, b7=0, b6=0, b5=0, b4=0, b3=0, b2=0, b1=0, b0=0.

At this time, the plurality of first fault address information FA1, FA2, FA3, . . . , FAn provided through the probe test operation are generated earlier than the plurality of second fault address information FAK1, FAK2, FAK3, . . . , FAKm provided through the package test operation, and the fault address information is not again generated after the package test operation. Thus, the actually used number of the plurality of first fault address information FA1, FA2, FA3, . . . , FAn provided through the probe test operation is to be known, but the actually used number of the plurality of second fault address information FAK1, FAK2, FAK3, . . . , FAKm provided through the package test operation need not be known. Therefore, since the value of the end address information bit (EAIB) included in the last one of the first fault address information which is actually used when the plurality of first fault address information FA1, FA2, FA3, . . . , FAn provided through the probe test operation are stored in the first storage unit 100 is correctly defined (it means that EAIB of the first fault address information, which is not the last one, is defined as "0" and the EAIB of the last one of the first fault address information is defined as "1"), the value may be used to determine the actually used number of the first fault address information FA1, FA2, FA3, . . . , FAn. However, even though the value of the end address information bit (EAIB) included in the last one of the second fault address information which is actually used when the plurality of second fault address information FAK1, FAK2, FAK3, . . . , FAKm provided through the package test operation are stored in the second storage unit 110 is not correctly defined (it means that EAIB of the second fault address information, which is not the last one, is defined as "1" to indicate the last one, or the EAIB of the last one of the first fault address information is defined as "0" to indicate the first one), the overall operation of the present invention is not deteriorated even though the actually used number of the second fault address information FAK1, FAK2, FAK3, . . . , FAKm is not known as the result of the incorrect definition. Of course, since the space for storing the test information bit (TIB) and the end address information bit (EAIB) is already set in the fault address information, it is better that the value of the end address information bit (EAIB) included in the last one of the second fault address information, which is actually used for an additional operation using the actually used number of the second fault address information FAK1, FAK2, FAK3, . . . , FAKm is correctly defined.

The address providing unit 140 includes an address counting unit 142 and an address number information output unit 144. The address counting unit 142 counts storage space selection addresses COL_ADDR<1:n, n+1:n+m> corresponding to the plurality of first fault address storage spaces and the plurality of second fault address storage spaces, and sequentially provide the redundancy operation unit 120 with the plurality of first fault address information FA1, FA2, FA3, . . . , FAn read from the first storage unit 100 and the plurality of second fault address information FAK1, FAK2, FAK3, . . . , FAKm read from the second storage unit 110. The address number information output unit 144 outputs, as the address number information COL_ADDR<HIT>, the storage space selection addresses COL_ADDR<1:n, n+1:n+m> corresponding to the first fault address information, whose end address information bit (EAIB) has a set value (in general, EAIB=1, where this value can be selected according to various design needs), among the plurality of first fault address information FA1, FA2, FA3, . . . , FAn sequentially provided through the operation of the address counting unit 142.

In addition, the address number information output unit 144 includes a fault address information detection unit 1442 and an address number information storage unit 1444. The fault address information detection unit 1442 detects the first fault address information (one of FA1, FA2, FA3, . . . , FAn), whose end address information bit (EAIB) has a set value, among the plurality of first fault address information FA1, FA2, FA3, . . . , FAn sequentially provided through the operation of the address counting unit 142. The address number information storage unit 1444 stores the storage space selection address corresponding to the first fault address information detected by the fault address information detection unit 1442 (which means the storage space selection address COL_ADDR<1:n, n+1:n+m> corresponding to any one value of FA1, FA2, FA3, . . . , FAn) as the address number information COL_ADDR<HIT> and provides the storage space selection address to the redundancy operation unit 120.

The redundancy operation unit 120 includes a plurality of redundancy operation circuits 122<1:P>, a fault address transfer unit 124, and a redundancy selection address generation unit 126. The plurality of redundancy operation circuits 122<1:P> perform a redundancy operation in response to the applied fault address information (the plurality of first fault address information FA1, FA2, FA3, . . . , FAn and the plurality of second fault address information FAK1, FAK2, FAK3, . . . , FAKm). The fault address transfer unit 124 transfers the fault address information, whose test information bit (TIB) has a set value (in general, TIB=0, where this value can be selected according to different design needs), among the first fault address information FA1, FA2, FA3, . . . , FAn and the second fault address information FAK1, FAK2, FAK3, . . . , FAKm sequentially provided through the address providing unit 140, to the redundancy operation circuit corresponding to the redundancy selection address RDD_ADDR<1:P> among the plurality of redundancy operation circuits 122<1:P>. The redundancy selection address generation unit 126 generates the redundancy selection address RDD_ADDR<1:P> by performing a set operation between the storage space selection addresses COL_ADDR<1:n, n+1:n+m> and the address number information COL_ADDR<HIT>.

The fault address transfer unit 124 activates a transfer confirmation signal TRANS_O/F when the test information bits (TIB) of the first fault address information FA1, FA2, FA3, . . . , FAn and the second fault address information FAK1, FAK2, FAK3, . . . , FAKm sequentially provided through the address providing unit 140 have a set value, and deactivates the transfer confirmation signal TRANS_O/F when the test information bits (TIB) of the first fault address information FA1, FA2, FA3, . . . , FAn and the second fault address information FAK1, FAK2, FAK3, . . . , FAKm sequentially provided through the address providing unit 140 do not have a set value.

The redundancy selection address generation unit 126 changes the redundancy selection address RDD_ADDR<1:P> by the variation width of the storage space selection address COL_ADDR<1:n, n+1:n+m> from its initial value (1) in a period in which the output signal ERR_END_HIT of the fault address information detection unit 1442 maintains a deactivated state and the transfer confirmation signal TRANS_O/F maintains an activated state when setting the address number information COL_ADDR<HIT> through the operation of the fault address information detection unit 1442 is not completed. On the other hand, the redundancy selection address generation unit 126 changes the redundancy selection address RDD_ADDR<1:P> by the variation width of the storage space selection address COL_ADDR<1:n, n+1:n+m> from the value corresponding to the address number information COL_ADDR<HIT> in a period in which the output signal ERR_END_HIT outputted from the fault address information detection unit 1442 maintains an activated state and the transfer confirmation signal TRANS_O/F also maintains an activated state when setting the address number information COL_ADDR<HIT> through the operation of the fault address information detection unit 1442 is completed. In a period in which the transfer confirmation signal TRANS_O/F maintains an activated state, the redundancy selection address RDD_ADDR<1:P> is not changed, without regard to the variation width of the storage space selection address COL_ADDR<1:n, n+1:n+m>.

The operation of the nonvolatile memory device in accordance with the embodiment of the present invention will be described based on the above-mentioned configuration.

FIG. 2 is a flowchart illustrating the operation of the nonvolatile memory device of FIG. 1 in accordance with the embodiment of the present invention.

As explained in the above-mentioned configuration, the plurality of first fault address information FA1, FA2, FA3, . . . , FAn, to which the test information bit (TIB) and the end address information bit (EAIB) are added, is stored in the first storage unit 100, and the plurality of second fault address information FAK1, FAK2, FAK3, . . . , FAKm, to which the test information bit (TIB) and the end address information bit (EAIB) are added, is stored in the second storage unit 110. Such a state may be set differently according to different design needs when the probe test and the package test are performed on the nonvolatile memory device. Here, the setting operation is not illustrated in the operation flowchart of FIG. 2. In addition, the following description is provided based on an assumption that all internal bit values (including the test information bit (TIB) and the end address information bit (EAIB)) of the first fault address information which is not actually used among the plurality of first fault address information FA1, FA2, FA3, . . . , FAn stored in the first storage unit 100 are in a reset state of "1". Additionally, it is assumed that all internal bit values (including the test information bit (TIB) and the end address information bit (EAIB)) of the second fault address information which is not actually used among the plurality of second fault address information FAK1, FAK2, FAK3, . . . , FAKm stored in the second storage unit 110 are in a reset state of "1". For example, if the plurality of first fault address information FA1, FA2, FA3, . . . , FAn and the plurality of second fault address information FAK2, FAK2, FAK3, . . . , FAKm consist of 2-byte codes, the reset value of the actually unused state will become a state in which the plurality of first fault address information FA1, FA2, FA3, . . . , FAn and the plurality of second fault address information FAK1, FAK2, FAK3, . . . , FAKm have an "FF" value.

The operation of the nonvolatile memory device in accordance with the embodiment of the present invention will be described in more detail with reference to FIGS. 1 and 2. When the storage space selection addresses COL_ADDR<1:n, n+1:n+m> are counted by the address counting unit 142 and the count value changes, the plurality of fault address information FA1, FA2, FA3, . . . , FAn and the plurality of second fault address information FAK1, FAK2, FAK3, . . . , FAKm stored in the first storage unit 100 and the second storage unit 110 are read through the following operations (steps 200 and 240).

It can be seen that "n" storage space selection addresses COL_ADDR<1:n> from the minimum value "1" to "n" among the storage space selection addresses COL_ADDR<1:n, n+1:n+m> are addresses corresponding to the first storage unit 100. That is, the first storage unit 100 includes "n" first fault address storage spaces for storing "n" first fault address information FA1, FA2, FA3, . . . , FAn because addresses for selecting the "n" first fault address storage spaces are the "n" storage space selection addresses COL_ADDR<1:n>.

It can be seen that "m" storage space selection addresses COL_ADDR<n+1:n+m> from "n+1" to "n+m" among the storage space selection addresses COL_ADDR<1:n, n+1:n+m> are addresses corresponding to the second storage unit 110. That is, the second storage unit 110 includes "m" second fault address storage spaces for storing "m" second fault address information FAK1, FAK2, FAK3, . . . , FAKm because addresses for selecting the "m" second fault address storage spaces are the "m" storage space selection addresses COL_ADDR<n+1:n+m>.

In such a state, sequentially counting the storage space selection addresses COL_ADDR<1:n, n+1:n+m> from the minimum value "1" to "n+m" will sequentially output all data stored in the first storage unit 100 and the second storage unit 110. Thus, the variation of the count value of the storage space selection addresses COL_ADDR<1:n, n+1:n+m> by the address counting unit 142 is identical to sequentially reading (steps 200 and 240) the plurality of first fault address information FA1, FA2, FA3, . . . , FAn and the plurality of second fault address information FAK1, FAK2, FAK3, . . . , FAKm stored in the first storage unit 100 and the second storage unit 110.

At this time, among the plurality of first fault address information FA1, FA2, FA3, . . . , FAn stored in the first storage unit 100 and the plurality of second fault address information FAK1, FAK2, FAK3, . . . , FAKm stored in the second storage unit 110, in the fault address information into which actual value is programmed, the test information bit (TIB) is set to "0". In the case of the actually unused fault address information, the test information bit (TIB) is set to "1".

Therefore, while the plurality of first fault address information FA1, FA2, FA3, . . . , FAn and the plurality of second fault address information FAK1, FAK2, FAK3, . . . , FAKm are provided from the first storage unit 100 and the second storage unit 110 to the plurality of redundancy operation circuits 122<1:P>, only the actually used fault address information among the plurality of first fault address information FA1, FA2, FA3, . . . , FAn and the plurality of second fault address information FAK1, FAK2, FAK3, . . . , FAKm are passed through the fault address transfer unit 124, and the actually unused fault address information is filtered (steps 210 and 260).

For example, it is assumed that the number of the first actually used fault address information is 60 even though the total number of the first fault address information FA1, FA2, FA3, . . . , FAn is 100, and the number of the second actually used fault address information is 30 even though the total number of the second fault address information FAK1, FAK2, FAK3, . . . , FAKm is 100. While the plurality of the first fault address information FA1, FA2, FA3, . . . , FAn and the plurality of second fault address information FAK1, FAK2, FAK3, . . . , FAKm pass through the fault address transfer unit 124, only 60 first fault address information FA1, FA2, FA3, . . . , FA60 and 30 second fault address information FAK1, FAK2, FAK3, . . . , FAKm are passed and applied to 90 redundancy operation circuits 122<1:90>.

In the case of the last one of the fault address information into which the actual value is programmed by the probe test operation among the plurality of first fault address information FA1, FA2, FA3, . . . , FAn stored in the first storage unit 100 and the plurality of second fault address information FAK1, FAK2, FAK3, . . . , FAKm stored in the second storage unit 110, the end address information bit (EAIB) is set to "1". In the case of the fault address information, which is actually used but is not the last one, the end address information bit (EAIB) is set to "0".

Therefore, while the plurality of first fault address information FA1, FA2, FA3, . . . , FAn and the second plurality of second fault address information FAK1, FAK2, FAK3, . . . , FAKm are provided from the first storage unit 100 and the second storage unit 110 to the plurality of redundancy operation circuits 122<1:P>, the actually used number of the first fault address information FA1, FA2, FA3, . . . , FAn and the second fault address information FAK1, FAK2, FAK3, . . . , FAKm can be known if the fault address information detection unit 1442 detects the value of the end address information bit (EAIB) of the first fault address information FA1, FA2, FA3, . . . , FAn and the second fault address information FAK1, FAK2, FAK3, . . . , FAKm (step 220).

If the end address information bit (EAIB) of the $60^{th}$ first fault address information FA60 is "1" even though the total number of the plurality of first fault address information FA1, FA2, FA3, . . . , FAn is 100, 60 first fault address information FA1, FA2, FA3, . . . , FA60 among the first fault address information FA1, FA2, FA3, . . . , FAn are actually used, and the remaining 40 first fault address information FA61, FA62, FA63, . . . , FA100 are not actually used. Likewise, if the end address information bit (EAIB) of the $30^{th}$ second fault address information FAK30 is "1" even though the total number of the plurality of second fault address information FAK1, FAK2, FAK3, . . . , FAKn is 100, 30 second fault address information FAK1, FAK2, FAK3, . . . , FAK30 among the second fault address information FAK1, FAK2, FAK3, . . . , FAKm are actually used, and the remaining 70 second fault address information FAK31, FAK32, FAK33, . . . , FAK100 are not actually used. For reference, in this embodiment, since the operation of obtaining the actually used number of the second fault address information FAK1, FAK2, FAK3, . . . , FAKm is well known, the corresponding circuit is not directly implemented. Here, the fault address information circuit illustrated in FIG. 1 may be any reasonably suitable circuit for obtaining the actually used number of the first fault address information FA1, FA2, FA3, . . . , FAn.

The address number information storage unit 1444 stores, as the address number information COL_ADDR<HIT>, the storage space selection addresses COL_ADDR<1:n, n+1:n+ m> indicating the first fault address storage spaces of the first storage unit 100 in which the first fault address information having the end address information bit (EAIB) of "1" among the first fault address information FA1, FA2, FA3, . . . , FAn has been stored.

For example, if the end address information bit (EAIB) of the $60^{th}$ first fault address information FA60 is "1" even though the total number of the plurality of first fault address information FA1, FA2, FA3, . . . , FAn is 100, the storage space selection address COL_ADDR<60> indicating the first fault address storage space of the first storage unit 100 in which the $60^{th}$ first fault address information FA60 has been stored is stored as the address number information COL_ADDR<HIT>.

The operation of the redundancy selection address generation unit 126 may be separated as follows.

In a case in which the setting of the address number information COL_ADDR<HIT> is not completed through the fault address information detection unit 1442, the actually used number of the first fault address information FA1, FA2, FA3, . . . , FAn is unknown. Therefore, the output signal ERR_END_HIT of the fault address information detection unit 1442 maintains a deactivated state. At this time, if the transfer confirmation signal TRANS_O/F outputted from the fault address transfer unit 124 maintains an activated state, it means that the first fault address information FA1, FA2, FA3, . . . , FAn are sequentially supplied from the first storage unit 100 to the plurality of redundancy operation circuits 122<1:P>. Thus, the redundancy selection address RDD_ADDR<1:P> are correspondingly changed from the initial value according to the variation width of the storage space selection addresses COL_ADDR<1:n, n+1:n+m> (step 210).

For example, in the process in which the first fault address information FA1, FA2, FA3, . . . , FAn, whose actually used number is 60, is read from the first storage unit 100 and transferred to the plurality of redundancy operation circuits 122<1:P>, the $1^{st}$ to $60^{th}$ first fault address information FA1, FA2, FA3, . . . , FA60 are sequentially transferred to the $1^{st}$ to $60^{th}$ redundancy operation circuits 122<1:6>. At this time, in order to sequentially select the $1^{st}$ to $60^{th}$ redundancy operation circuits 122<1:60>, the redundancy selection addresses RDD_ADDR<1:P> is to be changed from the $1^{st}$ redundancy selection address RDD_ADDR<1> to the $60^{th}$ redundancy selection address RDD_ADDR<60>. However, the storage space selection addresses COL_ADDR<1:n, n+1:n+m> are already changing in order to select the 60 first fault address information FA1, FA2, FA3, . . . , FA60. Therefore, if the redundancy selection addresses RDD_ADDR<1:P> is changed from the initial value by the variation width of the storage space selection addresses COL_ADDR<1:n, n+1:n+m>, the first fault address information FA1, FA2, FA3, . . . , FAn provided by the storage space selection addresses COL_ADDR<1:n, n+1:n+m> can be sequentially stored in the plurality of redundancy operation circuits 122<1:P>.

In a case in which the setting of the address number information COL_ADDR<HIT> is completed through the fault address information detection unit 1442, the actually used number of the first fault address information FA1, FA2, FA3, . . . , FAn is known. Therefore, the output signal ERR_END_HIT of the fault address information detection unit 1442 maintains an activated state. At this time, if the transfer confirmation signal TRANS_O/F outputted from the fault address transfer unit 124 maintains an activated state, it means that the second fault address information FAK1, FAK2, FAK3, . . . , FAKm are sequentially supplied from the second storage unit 110 to the plurality of redundancy operation circuits 122<1:P>. Thus, the redundancy selection address RDD_ADDR<1:P> may be changed from the value corresponding to the address number information COL_ADDR<HIT> according to the variation width of the storage space selection addresses COL_ADDR<1:n, n+1:n+m> (steps 250 and 260).

The reason for sequentially changing the redundancy selection addresses RDD_ADDR<1:P> from the value corresponding to the address number information COL_ADDR<HIT> (step 250) is that, due to the operation of the fault address transfer unit 124, the actually used ones of the first fault address information FA1, FA2, FA3, . . . , FAn are supplied to the plurality of redundancy operation circuits 122<1:P>, and the actually unused ones thereof are not supplied with the first fault address information FA1, FA2, FA3, . . . , Fan. Here, the number of the redundancy operation circuits used in the redundancy operation among the plurality of redundancy operation circuits 122<1:P> becomes the actually used number of the first fault address information FA1, FA2, FA3, . . . , FAn. However, at the point of time when the second fault address information FAK1, FAK2, FAK3, . . . , FAKm is supplied to the plurality of redundancy operation circuits 122<1:P>, the count value of the storage space selection addresses COL_ADDR<1:n, n+1:n+m> is larger than "n". That is, at the point of time when the second fault address information FAK1, FAK2, FAK3, . . . , FAKm is supplied to the plurality of redundancy operation circuits 122<1:P>, the difference between the count value of the storage space selection addresses COL_ADDR<1:n, n+1:n+m> and the number of the redundancy operation circuits used in the redundancy operation among the plurality of redundancy operation circuits 122<1:P> is relatively large.

Therefore, if the redundancy selection addresses RDD_ADDR<1:P> are sequentially changed from the value corresponding to the address number information COL_ADDR<HIT> having the storage space selection addresses COL_ADDR<1:n, n+1:n+m> corresponding to the actually used number of the first fault address information FA1, FA2, FA3, . . . , FAn, only the actually used information of the first fault address information FA1, FA2, FA3, . . . , FAn and the actually used information of the second fault address information FAK1, FAK2, FAK3, . . . , FAKm are applied to the redundancy selection addresses RDD_ADDR<1:P>.

For example, in a case in which the total number of the plurality of first fault address information FA1, FA2, FA3, . . . , FAn is 100, after the 60 first fault address information FA1, FA2, FA3, . . . , FA60 actually used are provided to the 60 redundancy operation circuits 122<1:60>, the 40 first fault address information FA61, FA62, FA63, . . . , FA100 are not provided to the plurality of redundancy operation circuits 122<1:P>. However, in reading the 40 first fault address information FA61, FA62, FA63, . . . , FA100, the storage space selection addresses COL_ADDR<1:n, n+1:n+m> are counted 40 times (COL_ADDR<61→100>). Thereafter, the actually used information of the plurality of second fault address information FAK1, FAK2, FAK3, . . . , FAKm is to be provided from the $70^{th}$ redundancy operation circuit 122<70:P>. Since the storage space selection addresses COL_ADDR<1:n, n+1:n+m> have already been counted up to the $101^{st}$ count value COL_ADDR<101>, it is not directly applied to the $70^{th}$ redundancy selection address RDD_ADDR<70>. Thus, if the redundancy selection address RDD_ADDR<1:P> is sequentially changed by the variation width of the storage space selection address COL_ADDR<1:n, n+1:n+m> from the address number information COL_ADDR<HIT> corresponding to the state in which the storage space selection address COL_ADDR<1:n, n+1:n+ m> is counted seventy times (COL_ADDR<70>), it is changed from the 71$^{st}$ redundancy selection address RDD_ADDR<71> and the actually used information of the plurality of second fault address information FAK1, FAK2, FAK3, . . . , FAKm is stored in the 71$^{st}$ to P$^{th}$ redundancy operation circuits 122<71:P>.

When the transfer confirmation signal TRANS_O/F outputted from the fault address transfer unit 124 maintains a deactivated state, the redundancy selection addresses RDD_ADDR<1:P> are not changed, without regard to the variation of the storage space selection addresses COL_ADDR<1:n, n+1:n+m>. That is, the first fault address information which is not actually used among the above-described first fault address information FA1, FA2, FA3, . . . , FAn are filtered while passing through the fault address transfer unit 124, and are not provided to the plurality of redundancy operation circuits 122<1:P>. For such an operation, the transfer confirmation signal TRANS_O/F is deactivated. Of course, even though the transfer confirmation signal TRANS_O/F is deactivated and no fault address information is provided to the plurality of redundancy operation circuits 122<1:P>, the storage space selection addresses COL_ADDR<1:n, n+1:n+m> is not changed due to the operation of the address counting unit 142.

As described above, according to an exemplary embodiment of the present invention, the fault address information corresponding to the probe test operation and the fault address information corresponding to the package test operation are programmed into different storage spaces distinguished by independent erase operations. Thus, the fault column address information of the nonvolatile memory device can be programmed into the CAM cell array properly, without using the memory of the test device.

In addition, since the division of the redundancy resources is determined based on the number of the fault address information corresponding to the probe test operation, the size of the redundancy resources allocated to the probe test operation and the size of the redundancy resources allocated to the package test operation can be determined with great flexibility.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a first storage unit configured to store a plurality of first fault address information provided in a first test operation;
a second storage unit configured to store a plurality of second fault address information provided in a second test operation which is performed after the first test operation;
a redundancy operation unit configured to determine a number of operation circuits corresponding to the first fault address information and a number of operation circuits corresponding to the second fault address information based on address number information from an address providing unit and enable a plurality of redundancy operation circuits in response to the determined the number of operation circuits corresponding to the first and second fault address information; and
the address providing unit configured to detect the number of the first fault address information to generate the address number information.

2. The nonvolatile memory device of claim 1, wherein the first storage unit comprises a plurality of first fault address storage spaces for storing the plurality of first fault address information provided in the first test operation and storing a test information bit and an end address information bit that are added to each of the plurality of first fault address information stored in the plurality of first fault address storage spaces.

3. The nonvolatile memory device of claim 1, wherein the second storage unit comprises a plurality of second fault address storage spaces for storing the plurality of second fault address information provided in the second test operation and for storing a test information bit and an end address information bit that are added to each of the plurality of second fault address information stored in the plurality of second fault address storage spaces.

4. The nonvolatile memory device of claim 3, wherein the first test operation is a probe test operation and the second test operation is a package test operation.

5. The nonvolatile memory device of claim 1, wherein the address providing unit comprises:
an address counting unit configured to count storage space selection addresses corresponding to a plurality of first fault address storage spaces and the plurality of second fault address storage spaces to provide the counted storage space selection addresses with the first and second storage units; and
an address number information output unit configured to output, as the address number information, the storage space selection address corresponding to end address information bit of the first fault address information among the plurality of first fault address information,
wherein the first fault address information and second fault address information are sequentially provided to the redundancy operation unit and the address providing unit in response to the counted storage space selection addresses.

6. The nonvolatile memory device of claim 5, wherein the address number information output unit comprises:
a fault address information detection unit configured to detect the end address bit of first fault address information having a set value among the plurality of first fault address information; and
an address number information storage unit configured to store the storage space selection address corresponding to the first fault address information detected by the fault address information detection unit as the address number information and provide the storage space selection address to the redundancy operation unit.

7. The nonvolatile memory device of claim 5, wherein the redundancy operation unit comprises:
a plurality of redundancy operation circuits configured to perform a redundancy operation in response to the applied fault address information;
a fault address transfer unit configured to transfer the fault address information, whose test information bit has a set value, among the first fault address information and the second fault address information, to the redundancy operation circuit corresponding to a redundancy selection address; and
a redundancy selection address generation unit configured to generate the redundancy selection address by performing a set operation between the storage space selection addresses and the address number information.

8. The nonvolatile memory device of claim 7, wherein the fault address transfer unit is configured to activate a transfer confirmation signal when the test information bits of the first fault address information and the second fault address information have a set value and deactivate the transfer confirmation signal when the test information bits of the first fault address information and the second fault address information do not have a set value.

9. The nonvolatile memory device of claim 8, wherein,
when setting the address number information through the operation of the fault address information detection unit is not completed, the redundancy selection address generation unit is configured to change the redundancy selection address by a variation width of the storage space selection address from an initial value thereof in a period in which the transfer confirmation signal maintains an activated state,
when setting the address number information through the operation of the fault address information detection unit is completed, the redundancy selection address generation unit is configured to change the redundancy selection address by a variation width of the storage space selection address from a value corresponding to the address number information in a period in which the transfer confirmation signal maintains an activated state, and
in a period in which the transfer confirmation signal maintains an activated state, the redundancy selection address generation unit is configured not to change the redundancy selection address regardless of a variation of the storage space selection address.

10. A method for operating a nonvolatile memory device having a plurality of redundancy operation circuits for performing a redundancy operation, the method comprising:
storing a plurality of first fault address information provided in a first test operation and detecting a number of the plurality of stored first fault address information;
storing a plurality of second fault address information provided in a second test operation; and
allocating redundancy operation circuits corresponding to the plurality of first and second fault address information among the plurality of redundancy operation circuits based on the detected number of the first fault address information,
wherein a test information bit and an end address information bit are added to each of the plurality of first fault address information.

11. The method of claim 10, wherein the detecting of the number of the plurality of stored first fault address information comprises:
sequentially reading the plurality of stored first fault address information;
confirming whether the end address information bit of each of the plurality of first fault address information sequentially read has a set value; and
counting the plurality of first fault address information sequentially read and completing a counting operation in response to a result of the confirming as to whether the end address information bit of each of the plurality of first fault address information sequentially read has a set value.

12. The method of claim 11, wherein the allocating of the redundancy operation circuits comprises:
allocating the redundancy operation circuits so that a number of redundancy operation circuits equal to the counted number among the plurality of redundancy operation circuits perform the redundancy operation in correspondence to the plurality of first fault address information; and
allocating the redundancy operation circuits so that non-counted redundancy operation circuits among the plurality of redundancy operation circuits perform the redundancy operation in correspondence to the plurality of second fault address information.

13. The method of claim 12, wherein, in the allocating of the redundancy operation circuits,
the first fault address information, whose test information bit has a set value, among the plurality of first fault address information applied to the plurality of redundancy operation circuits is transferred and the first fault address information, whose test information bit does not have the set value, is not transferred.

14. The method of claim 10, wherein a test information bit and an end address information bit are included in each of the plurality of second fault address information.

15. The method of claim 14, wherein the detecting of the number of the plurality of stored first fault address information comprises:
sequentially reading the plurality of stored first fault address information;
sequentially reading the plurality of stored second fault address information;
confirming whether the end address information bit of each of the plurality of first fault address information sequentially read has a set value;
confirming whether the end address information bit of each of the plurality of second fault address information sequentially read has a set value;
counting the plurality of first fault address information sequentially read and completing a first counting operation in response to a result of the confirming as to whether the end address information bit of each of the plurality of first fault address information sequentially read has a set value; and
counting the plurality of second fault address information sequentially read and completing a second counting operation in response to the confirmed result.

16. The method of claim 15, wherein the allocating of the redundancy operation circuits comprises:
allocating the redundancy operation circuits so that a number of redundancy operation circuits equal to the number counted in the first counting operation among the plurality of redundancy operation circuits perform the redundancy operation in correspondence to the plurality of first fault address information; and
allocating the redundancy operation circuits so that a number of redundancy operation circuits equal to the number counted in the second counting operation among the plurality of redundancy operation circuits perform the redundancy operation in correspondence to the plurality of second fault address information, wherein the other redundancy operation circuits except for the allocated redundancy operation circuits are allocated.

17. The method of claim 16, wherein the fault address information, whose test information bit has a set value, among the plurality of first and second fault address information are transferred to the plurality of redundancy operation circuits and the other first and second fault address information are not transferred to the plurality of redundancy operation circuits.

18. The method of claim 10, wherein the first test operation is a probe test operation and the second test operation is a package test operation.

* * * * *